United States Patent [19]

Uebele

[11] Patent Number: 5,539,301

[45] Date of Patent: Jul. 23, 1996

[54] MONOLITHICALLY INTEGRATED POWER OUTPUT STAGE

[75] Inventor: Manfred Uebele, Reutlingen, Germany

[73] Assignee: Robert Bosch GmbH, Stuttgart, Germany

[21] Appl. No.: 260,934

[22] Filed: Jun. 16, 1994

[30] Foreign Application Priority Data

Jun. 26, 1993 [DE] Germany .......................... 43 21 412.6
Sep. 30, 1993 [DE] Germany .......................... 43 33 359.1

[51] Int. Cl.$^6$ .............................. G05F 1/40; H01L 21/70
[52] U.S. Cl. ............................................ 323/282; 437/51
[58] Field of Search ............................. 363/16, 97, 131; 323/282, 284; 327/535, 538; 437/51

[56] References Cited

U.S. PATENT DOCUMENTS

| | | | |
|---|---|---|---|
| 3,665,330 | 5/1972 | Tharmaratnam | 330/24 |
| 4,905,067 | 2/1990 | Morelli et al. | 357/48 |
| 5,157,573 | 10/1992 | Lee et al. | 361/56 |
| 5,276,405 | 1/1994 | Mazzucco et al. | 330/257 |
| 5,286,992 | 2/1994 | Ahrens et al. | 257/356 |
| 5,348,907 | 9/1994 | Migita | 437/59 |

FOREIGN PATENT DOCUMENTS 0284979  10/1988  European Pat. Off. .
1539090  4/1970  Germany .

*Primary Examiner*—Matthew V. Nguyen
*Attorney, Agent, or Firm*—Kenyon & Kenyon

[57] ABSTRACT

A monolithically integrated power output stage detects the load current through an output-stage transistor. Switch logic coupled to an output transistor is for switching the output transistor when a predetermined load-current threshold is reached. In this connection, the output transistor is integrated in a separate insulated π-well which contains, in addition, a diode which couples the π-region of the π-well to a ground terminal. This limits the maximum potential to a forward voltage of more than 0 volts and thereby prevents malfunction in normal operation since it leads shift currents in low-resistance to ground by capacitive coupling upon an increase in the voltage of the collector of the output-stage transistor.

9 Claims, 3 Drawing Sheets

MONOLITHICALLY INTEGRATED POWER OUTPUT STAGE

FIELD OF THE INVENTION

The present invention relates to a monolithically integrated power output stage. More specifically, the present invention relates to monolithically integrated power output stages with load-current detection.

BACKGROUND OF THE INVENTION

Power output stages with integrated logic for the detection of a load-current threshold are known in various embodiments. A typical application is in electronic ignition control devices for adjusting the dwell angle on automobile engines. Other types of current control for loads can also be developed with power output stages in which the reaching of the load-current threshold is indicated by the switching of an output transistor. In this case, it is also known to arrange this output transistor in an insulated π-well. This arrangement, by itself or in combination with a connection resistor, does not, however, assure dependable operation of the output transistor, since with limited inverse current, −Ic, a maximum possible noise current can occur which no longer assures the maintenance of a blocked condition of the output transistor.

SUMMARY OF THE INVENTION

The present invention pertains to a power output stage with means for detecting a load-current threshold and for indicating the reaching of the load-current threshold by the switching of an output transistor which is arranged in a π-well. The power output stage of the present invention has the advantage that the maximum potential is limited by a diode to a forward voltage of more than 0 volt (ground), which thereby prevents malfunction or switching off in normal operation. Shift currents are shunted to ground, with a low resistance to ground, by capacitive coupling upon an increase in voltage of the main collector.

The emitter of the output transistor is advisedly grounded and its collector is connected to a logic output. The fact that the load-current threshold has been reached is indicated by a signal change at the logic output.

For the blocking of the πn⁻-transfer of the π-well of the output transistor, in inverse operation of the main collector of the output stage transistor, it is advantageous to connect an additional transistor which lowers the potential of the π-well between the latter and the main collector. There is namely the danger that the logic output does not retain its blocked condition if, upon operation with an inductive load (for instance, an ignition coil or ignition transformer), the collector voltage drops below 0 volt so that inverse operation of the output-stage transistor occurs. Upon this inverse operation of the main collector, current flows over the inverse diode which bridges the switch path of the output-stage transistor and permits the potential on the main collector to drop to about −1.1 volt (depending on the inverse current, −Ic). In this way, the p-n junctions or πn⁻-junctions are no longer reliably blocked and bring about a malfunction at the logic output by signal inversion. By the insertion of the additional transistor which is developed in particular as an n⁻πv-transistor, the otherwise potentially floating π-well can be brought to a potential of about −0.9 volt during this signal inversion, namely a slightly more positive potential than the main collector. In this way, the p-n-junction (πn⁻-junction) of the π-well of the output transistor is dependably blocked and malfunction in the inverse operation of the main collector is dependably prevented. In the case of a bipolar power semiconductor process, the additional transistor can be integrated with only a small surface requirement. The function is in this connection substantially independent of variations in parameters of the process. The apparatus of the present invention is also readily applicable to several logic outputs.

The additional transistor may suitably be arranged in a separate π-well. In this case, the base of the additional transistor is connected to ground via a resistor, the collector is connected to the π-well of the output transistor, and the emitter is connected to the main collector. The resistance can be formed, in particular, by the π-region of the additional transistor.

One advantageous development of the output transistor, in accordance with the present invention, consists in its emitter being developed as an n⁺-region, its base as a p-region surrounding the n⁺-region, and its collector as a v-region surrounding the p-region.

The diode is preferably developed in a manner corresponding to the output transistor, the p-region which is connected to the v-region forming the anode of the diode which is connected to the π-region.

DETAILED DESCRIPTION OF THE DRAWINGS

Figure 1:
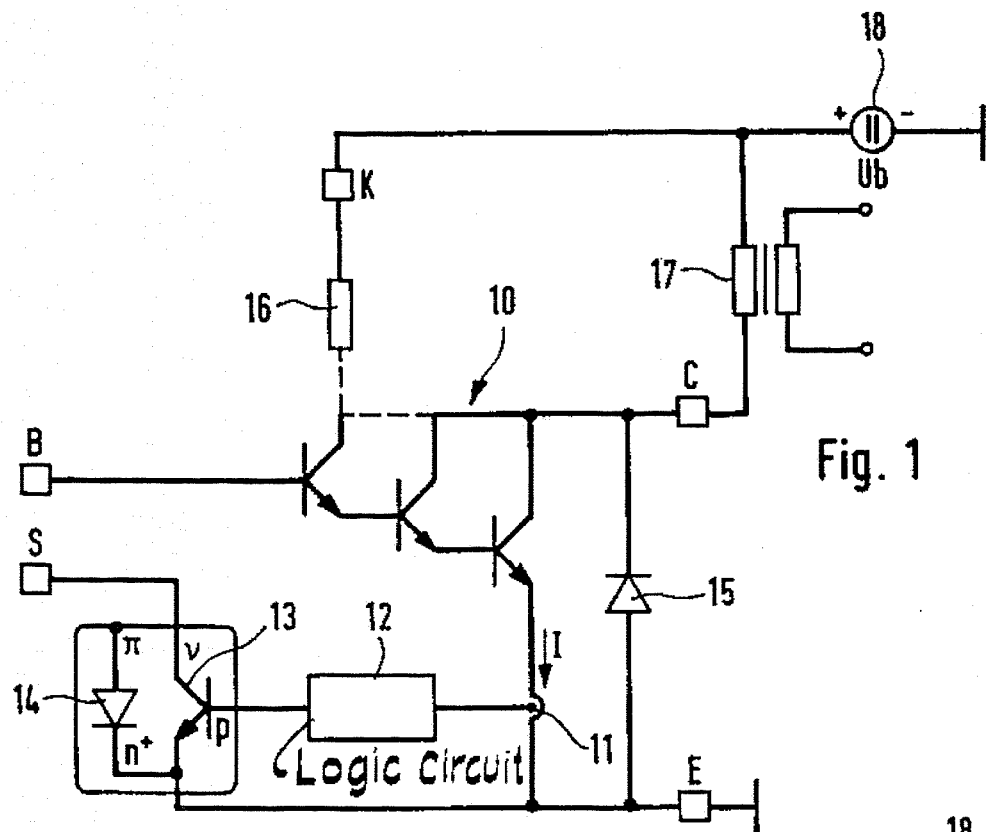
FIG. 1 is a circuit diagram of a first embodiment of a monolithically integrated power output stage in accordance with the present invention.

FIG. 1 is a circuit diagram of a first embodiment of a monolithically integrated power output stage in accordance with the present invention. The monolithically integrated power output stage of FIG. 1 includes essentially a three-stage, output-stage transistor 10, the collector of which is connected to an external collector terminal C, the emitter of which is connected to an external emitter terminal E, and the base of which is connected to an external base terminal B. The output-stage transistor 10 can also be developed in two stages.

A current sensor 11, which is developed, for instance, as a sense cell of the last transistor stage of the output-stage transistor 10, detects the load current through the output-stage transistor 10 and is connected to a logic circuit 12. The logic circuit 12 essentially contains a threshold value stage, and generates an output control signal for driving an output transistor 13 when the load current I exceeds an adjusted or adjustable load-current threshold.

Figure 4:
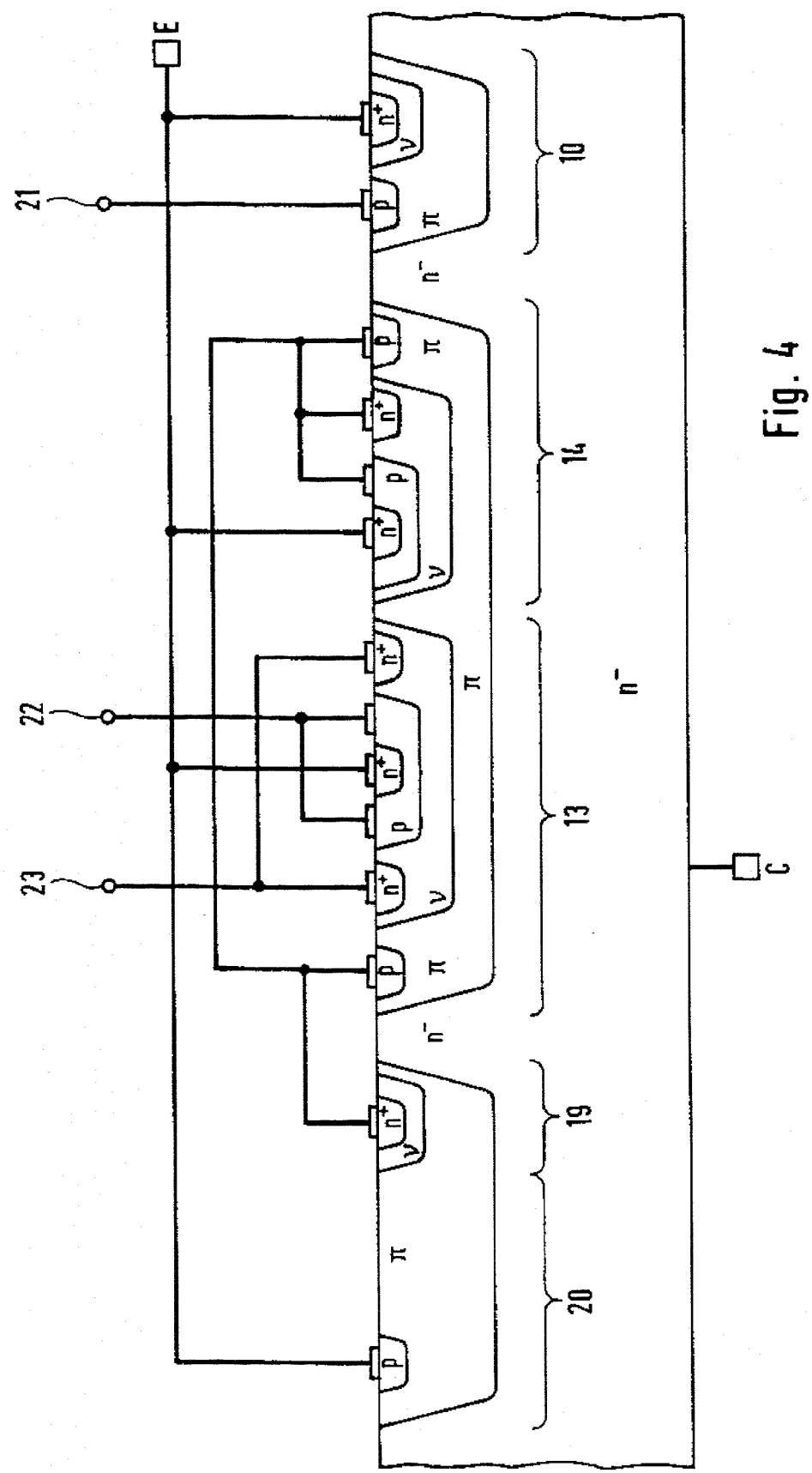
FIG. 4 is a cross-sectional view showing the diffusion zones of the monolithically integrated power output stage of FIG. 2.

By way of explanation, it may first of all be pointed out that a π-region corresponds to a weakly doped p-region and a v-region to a weakly doped n-region. The output transistor 13 is integrated in a separate π-well, with the emitter formed by an n⁺-region, the base by a p-region surrounding this n⁺-region, and the collector by a v-region which surrounds the p-region, as can be seen in FIG. 4. The collector is connected to an external logic output terminal S of the power output stage and the emitter is connected to the emitter terminal E of the power output stage. Furthermore, in the separate π-well, there is integrated a diode 14 with a cathode connected to the emitter of the output transistor 13 and an anode connected to the π-well itself.

As can be seen in FIG. 4, the diode 14 is constructed to correspond to the output transistor 13, with the p-region which forms the base being connected via an $n^+$-contact region to the ν-region which forms the collector. There is also a connection to one (or more) p-contact regions in the π-well, in order to assure a good ohmic connection there.

The power output stage furthermore comprises an inverse diode 15 which bridges over the switch path of the output-stage transistor 10. The collector of the first stage of the output-stage transistor 10 is connected to the external collector terminal C or, via a collector resistor 16, to another external terminal K. The terminal K and the collector resistor 16 are dispensed with if the collector of the first stage of the output-stage transistor 10 is connected to the external collector terminal C. The two alternative circuit possibilities are shown by dashed lines.

The power output stage of FIG. 1 is used for the control or regulation of an ignition transformer 17 of an ignition system (not shown in detail), for an internal combustion engine. The primary winding of the ignition transformer 17 is connected between the external collector terminal C and the positive terminal of a supply voltage source 18. The secondary winding of the ignition transformer 17 produces ignition pulses for spark plugs (not shown) in a known manner. If the external terminal K and the collector resistor 16 are provided and connected to the collector of the first stage of the final output-stage transistor 10, then the terminal K is also connected to the positive connection of the supply voltage source 18.

While the load current through the output-stage transistor 10 is below the load-current threshold, the output transistor 13 is blocked. The diode 14 limits the maximum potential of the π-well to a forward voltage of more than 0 volt (ground) and thereby prevents a malfunction in normal operation. The diode 14 conducts the shift currents by capacitive coupling with low resistance to ground upon an increase in the voltage of the main collector.

With the arrangement shown, regulation of the dwell angle, for example, in an ignition system can be effected.

Figure 2:
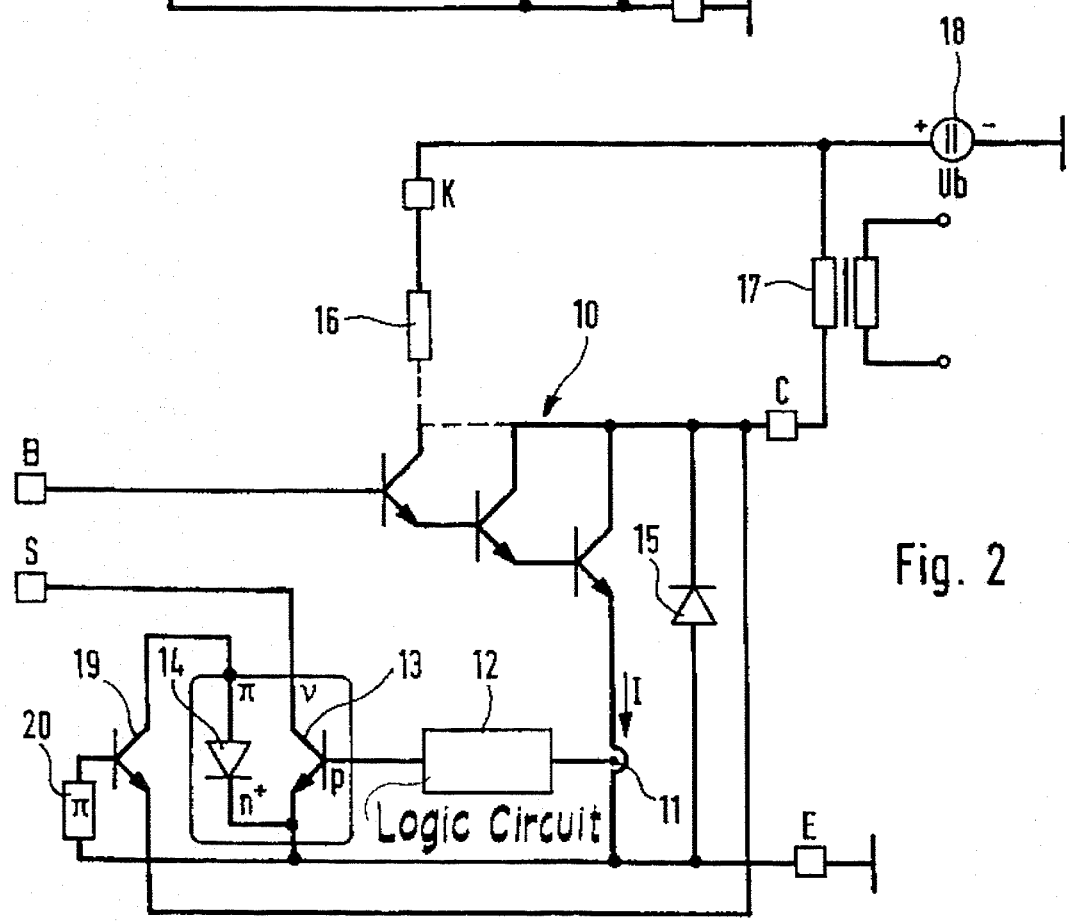
FIG. 2 is a circuit diagram of a second embodiment of a monolithically integrated power output stage having an additional transistor, in accordance with the present invention.
Figure 3:
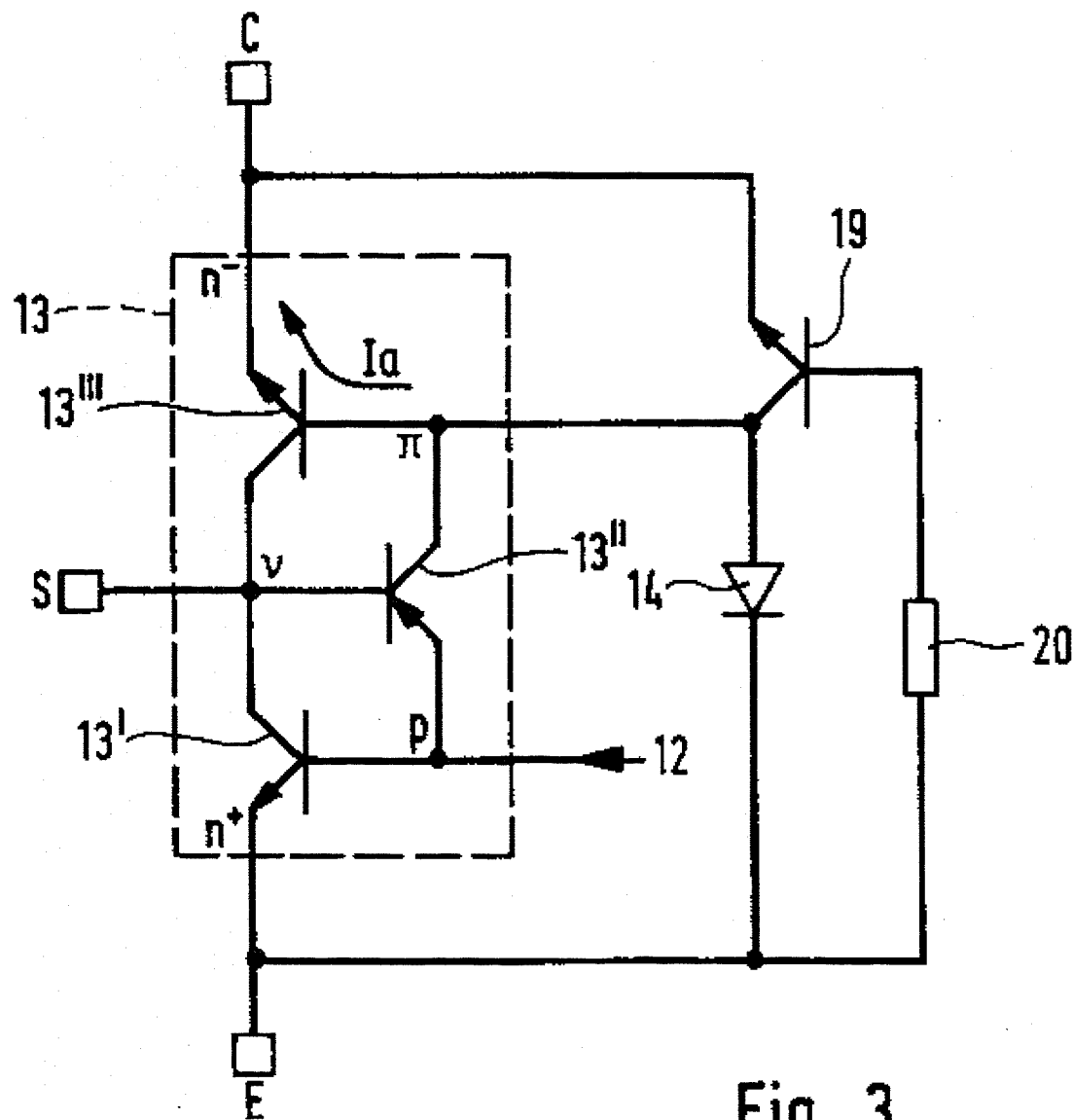
FIG. 3 is a circuit diagram showing part of the circuit of FIG. 2 with parasitic transistors.

The second embodiment shown in FIGS. 2 to 4, substantially corresponds to the first embodiment. The same parts or parts having the same function are shown with the same reference numerals and are not described again. In addition, in the second embodiment, the π-well which contains the output transistor 13 and the diode 14 is connected via the collector-emitter junction of another transistor 19 to the external collector terminal C. The base of the transistor 19 is connected via a resistor 20 to the external emitter terminal E.

In accordance with FIG. 4, the further transistor 19 is integrated in a further separate π-well, with its collector being realized by a ν-region, its base being realized by the further π-well itself, and its emitter being realized by the $n^-$-region for the entire power output stage. The ohmic connection of the collector of the further transistor 19 to the π-region of the output transistor 13 is effected via $n^+$- or p-diffusion and an electrical connection between the diffusions. The resistor 20 is realized, in the further π-well, by the resistance path between the transistor 19 and a p-diffusion region which is connected to the external emitter terminal E.

Furthermore, FIG. 4 also shows the last stage of the three-stage, final-stage transistor 10, which is also arranged in a separate π-well. The π-region which forms the base of the transistor 10 is connected to a base terminal 21 via a p-diffusion, while the ν-region forming the emitter is connected to the external emitter terminal E via an $n^+$-diffusion.

In the output transistor 13, already partly described in connection with the first embodiment, the p-region forming the base is connected to a base terminal 22. Furthermore, the ν-region forming the collector is connected to a collector terminal 23 via two $n^+$-diffusions. The other regions, for example the logic circuit 12 (which for the sake of simplification have not been shown in FIG. 4), are also monolithically integrated there.

In FIG. 3, a part of the circuit of FIG. 2 is reproduced in order to explain the problems which could occur during operation and how the present invention provides for them. The output transistor 13 is shown in FIG. 3 with the additional transistors which are formed upon the diffusion in accordance with FIG. 4. The transistor desired for the circuit is the transistor 13' which is formed between the $n^+$-, p- and ν-regions. In addition, however, another transistor, 13'', is formed between the p-, ν-, and π-regions. Finally, a transistor 13''' is also formed between the ν-, π-, and $n^-$-regions.

Upon the inverse operation of the main collector of the output-stage transistor 10, current flows over the conductive inverse diode 15 and permits the potential on the main collector C to drop to about −1.1 volt. This depends on the inverse current. In this way, the $\pi n^-$-junctions are no longer reliably blocked and give rise to a current Ia through the transistor 13'''. A signal inversion and thus a malfunction are thus brought about at the output S. During such a disturbance, the otherwise potentially floating π-well can be brought by the transistor 19 to a potential of about −0.9 volt, i.e. made more negative. In this way, the $\pi n^-$-junction of the π-well of the output transistor 13 is reliably blocked and a malfunction of the output transistor 13 in the inverse operation of the main collector is prevented.

What is claimed is:

1. A monolithically integrated power output stage comprising:

an output-stage transistor;

a current detector coupled to the output-stage transistor for detecting a load current through the output-stage transistor; and a switch logic coupled to the current detector and to an output transistor for switching the output transistor when the load current through the output-stage transistor reaches a predetermined load-current threshold;

wherein the output transistor is integrated in an insulated π-well which is developed as a separate π-well and which includes a diode coupling a π-region of the π-well to a ground terminal.

2. The power output stage according to claim 1, wherein an emitter of the output transistor is coupled to the ground terminal, and a collector of the output transistor is connected to a logic output.

3. The power output stage according to claim 1, further comprising an additional transistor coupled between the π-well and a collector of the output-stage transistor.

4. The power output stage according to claim 3, wherein the additional transistor is arranged in a separate π-well.

5. The power output stage according to claim 3, wherein the additional transistor includes a base which is coupled to the ground terminal via a resistor, a collector which is coupled to the π-well of the output transistor, and an emitter which is coupled to the collector of the output-stage transistor.

6. The power output stage according to claim 5, wherein the π-well of the additional transistor includes the resistor.

7. The power output stage according to claim 3, wherein the additional transistor is developed as an n⁻πν-transistor.

8. The power output stage according to claim 1, wherein the output transistor includes an emitter which is developed as an n⁺-region, a base which is developed as a p-region surrounding the n⁺-region, and a collector which is developed as a ν-region surrounding the p-region.

9. The power output stage according to claim 8, wherein the diode is developed to correspond to the output transistor, with a p-region of the diode being coupled to a ν-region which forms an anode of the diode, which anode is coupled to the π-region of the π-well.

* * * * *